(12) United States Patent
Schätz

(10) Patent No.: US 6,646,260 B2
(45) Date of Patent: Nov. 11, 2003

(54) MEASUREMENT TECHNIQUE FOR DETERMINING THE WIDTH OF A STRUCTURE ON A MASK

(75) Inventor: Thomas Schätz, Buchbach (DE)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 10/082,552

(22) Filed: Feb. 25, 2002

(65) Prior Publication Data

US 2002/0117618 A1 Aug. 29, 2002

(30) Foreign Application Priority Data

Feb. 23, 2001 (DE) ........................... 101 08 827

(51) Int. Cl.$^7$ ............................................. G01N 23/00
(52) U.S. Cl. ....................... 250/307; 250/311
(58) Field of Search ................. 250/307, 311

(56) References Cited

U.S. PATENT DOCUMENTS

| 4,600,832 A | * | 7/1986 | Grund ..................... 250/201.7 |
| 5,126,566 A | | 6/1992 | Shimada |
| 6,114,681 A | | 9/2000 | Komatsu |
| 6,140,644 A | | 10/2000 | Kawanami et al. |

FOREIGN PATENT DOCUMENTS

| EP | 0 781 976 A2 | 7/1997 |
| JP | 07 243 835 A | 9/1995 |
| JP | 11 237 230 A | 8/1999 |
| JP | 11 264 726 A | 9/1999 |

* cited by examiner

Primary Examiner—John R. Lee
Assistant Examiner—James J. Leybourne
(74) Attorney, Agent, or Firm—Laurence A. Greenberg; Werner H. Stemer; Ralph E. Locher

(57) ABSTRACT

A measurement technique for determining the width of a structure on a mask is described. During a focus sweep, the width of the structure on a photomask, and an edge slope thereof or the structure contrast thereof are measured on a scanning electron microscope by controlling a current through a flow in a magnetic lens by a control unit. To determine the best focus, a function is fitted to the measured values for the contrast and the angle of edge inclination and the focus is read off at the extreme value thereof. A further function is adapted to the values, measured in each case as a function of the focus for the structural width, and the functional value relating to the previously determined best focus is determined.

7 Claims, 3 Drawing Sheets

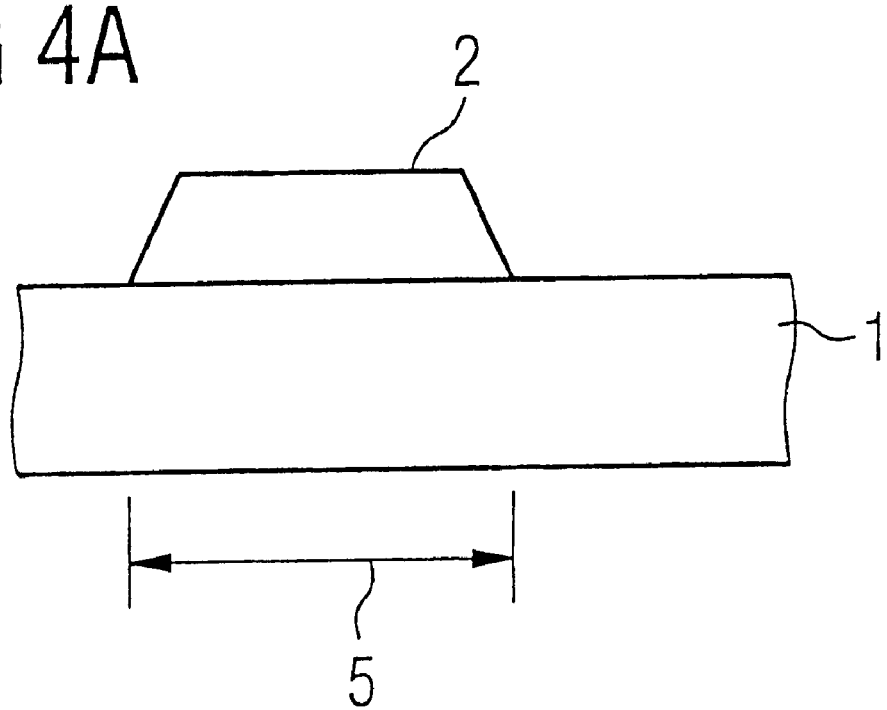
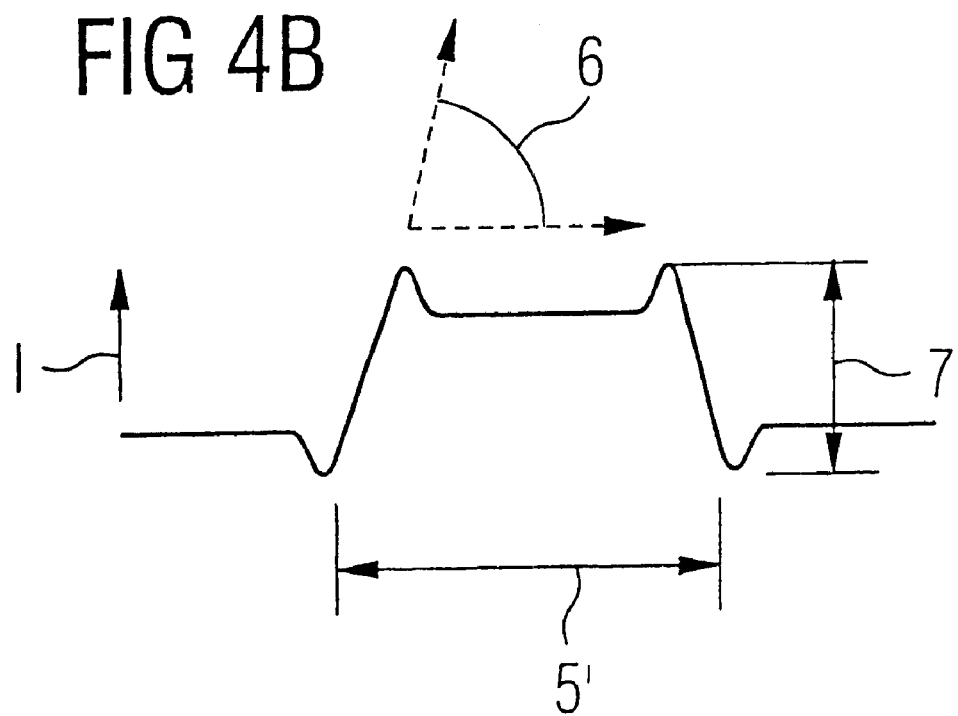

MEASUREMENT TECHNIQUE FOR DETERMINING THE WIDTH OF A STRUCTURE ON A MASK

BACKGROUND OF THE INVENTION

Field of the Invention

The present invention relates to a measurement technique for determining a width of a structure on a mask.

Because of its higher resolution, increasing use is being made of the scanning electron microscope (SEM) in mask inspection in response to the increasing demands placed on the observation of the ever reducing structural dimensions on photomasks. In this case, 3-σ-values of three nanometers are currently required for the reproducibility of structural width measurements in the case of these microscopes. Such low values for system-induced errors are required in order to be able to detect unambiguously production-induced deviations of the structural widths from prescribed specifications of, currently, approximately 20 nanometers. It is even expected for 2002 that deviations of only 10 nanometers can be determined. The specifications can scarcely yet be achieved by current light-optical microscopes.

In order to observe such low 3-σ-values in the case of scanning electron microscopes, it is necessary, in particular, to avoid inaccuracies in focusing. By feeding current into a magnetic lens, there is built up via a coil a magnetic field that focuses an electron beam, and acts as an objective and thereby reduces the electron beam at a distance denoted as a focus to a diameter of only 1–10 nm. Ideally, the surface, which is to be investigated, of the photomask is located at exactly this distance. Deviations from this distance are denoted as defocus. In the scanning electron microscope, the surface of the photomask is scanned by the electron beam by deflecting the electron beam line by line, the excited Auger electrons, which fall below the beam diameter, secondary electrons and, if appropriate, back-scattered electrons being picked up with the aid of a detector. Through shading effects, for example, the Auger electrons and secondary electrons, which amount to only a few electron volts, permit inferences relating to the surface topography of the photomask, or they also supply information on the first—viewed laterally—nanometers of the depth of the element structure, and at below the surface. Via a signal amplifier, the detected signal can, when plotted against the object scanning, be structured to form a substantially magnified image of the surface of the photomask. Any possible defocusing of the electron beam effects an expansion of the beam at the surface of the photomask, and thus a lower resolution of the individual surface structures.

Scanning electron microscopes used for mask inspection therefore use a multiplicity of focusing algorithms before the actual measurement of the respective structural width is undertaken. In a known method, a Fourier spectrum of the image determined is evaluated and a resolution-induced threshold frequency is used to determine the quality of the focus, this being followed by a focus correction with a new pick-up of the Fourier spectrum. The best focus is determined with the aid of an optimization method. Unfortunately, it is a common feature of all these focusing methods that the reproducibility of individual measurements is comparatively low, and this is caused, inter alia, by local spatial or temporal changes during measurement. This disadvantageously increases the three 3-σ-values for the measurements of structural widths on photomasks, as a result of which a value, usually not to be exceeded, for this purpose, of 25% of the prescribed tolerance range for structural widths (critical dimension) is in many cases exceeded.

SUMMARY OF THE INVENTION

It is accordingly an object of the invention to provide a measurement technique for determining the width of a structure on a mask which overcomes the above-mentioned disadvantages of the prior art methods of this general type, in which the scattering of measured values, is reduced, in structural width determinations repeatedly carried out by scanning electron microscopy such that it is possible to measure smaller structural widths.

With the foregoing and other objects in view there is provided, in accordance with the invention, a measurement technique for determining a width of a structure on a photomask. The method includes the steps of:

a) bringing the photomask with the structure into an object chamber of a scanning electron microscope;

b) adjusting a first focus value of a magnetic lens of the scanning electron microscope;

c) measuring a first width of the structure;

d) measuring a first value for a further parameter characterizing the structure;

e) adjusting a second focus value of the magnetic lens of the scanning electron microscope;

f) measuring a second width of the structure;

g) measuring a second value for the further parameter characterizing the structure;

h) adjusting a third focus value of the magnetic lens of the scanning electron microscope;

i) measuring a third width of the structure;

j) measuring a third value for the further parameter characterizing the structure;

k) adapting a first function with exactly one extreme value to the first, second and third values for the further parameter as a function of the first, second and third focuses, respectively, such that deviations of the first, second and third values from the first function are minimized;

l) determining a focus value assigned to the extreme value of the first function as a best focus;

m) adapting a second mathematical function with exactly one extreme value to the first, second and third widths of the structure as a function of the first, second and third focuses, respectively, such that deviations of the first, second and third widths from the second function are minimized; and n) determining the width of the structure in relation to a functional value of the second mathematical function which is assigned to the best focus.

The method proposed in accordance with the present invention is already known in a similar way from light-optical microscopes. In the case of the light-optical microscopes, the focus is adjusted as a rule mechanically or by piezoelectric effects by varying the distance between the wafer stage holding the mask and the microscope objective. In accordance with the present invention in the case of the scanning electron microscope the magnetic lens, which acts as the objective, is directly influenced preferably automatically by a control unit in such a way that the magnetic field focusing the electron beam changes due to a change in the controlled current flow for the purpose of adjusting various focusing strengths. The focus therefore does not, as in the light-optical case, describe the distance between the wafer stage and the objective, but the distance, determined by the strength of the magnetic field, of the strongest focusing of the beam from the magnetic lens. Ideally, the current flow in the coil generating the magnetic lens will generate a magnetic field such that the focus thus generated in the scanning electron microscope is equal to the distance of the surface of the photomask from the magnetic lens.

The invention is based on the finding that individual measurements cannot be reproduced by using different focusing algorithms. If a CD measurement is repeated by using a value for the focus adjusted with the aid of conventional algorithms, a scattering of the measured CD values results despite a constant focal value. The present invention circumvents this problem by virtue of the fact that the best focus is not fixed from the very start, but that use is made of further parameters that characterize the structure under consideration in an entirely local fashion—for example, the contrast or the slope of the structural edges in this case. The contrast describes the difference in intensity between the maximum measured value of the structure itself and the minimum measured value of the surroundings. The slope results from the intensity gradient at the location of the edge. The locally determined parameters directly supply the quality of the adjusted focus, and are therefore used in accordance with the present technique in order to determine the focus. Since a scatter can also be present here, the characteristic of the relevant measured parameter against the adjusted focal value is fitted by a mathematical function. The extreme value of such a fitted function reflects the best adjusted focal value.

In this document, the parameters characterizing the structure are denoted as those that permit the focus to be inferred directly because of their local validity. In addition to those mentioned, the designation therefore also includes combinations of the parameters such as structural contrast and slope, but also further parameters not illuminated here. It would also be possible to use the material contrast as a parameter.

In addition to the parameters, such as contrast or slope, obtained directly from the images taken with the scanning electron microscope, according to the invention the structural widths, that is to say the CD values, are also measured indirectly through the distance of the structural edges. As a function of the adjusted focal value, the CD values form a scattered distribution to which a mathematical function is fitted. Depending on whether the structure is bright or dark by comparison with the surroundings, the maximum or minimum of the function deviates as a rule in the argument, that is to say the focal value, from that of the best focus determined using the other parameters such as contrast or slope. Specifically, the maximum or minimum structural width measured for the focal value does not necessarily reflect an optimally adjusted focus. In some circumstances, however, only one variation of the distances of the edge profiles is found here as a function of the beam diameter or the focus. Smeared edge profiles owing to a poorly adjusted focus can supply maximum or minimum distances from one another, that is to say structural widths. The present technique precludes this by using the best focus obtained from the further parameter as an argument of the function obtained for the CD value, on which a statistically very effectively reproducible structural width can advantageously be read off or obtained.

Consequently, the system error ($3\sigma$) in the case of the scanning electron microscopes is substantially reduced for the measurement of structural widths, and it becomes possible to measure structural widths with tolerances of 10 nm.

In the case of scanning electron microscopes, there arises, moreover, the decisive advantage that no mechanical correction need be carried out, nor is there any need for prefocusing. Once the image has been taken for a focus, the next focal value can be adjusted immediately by changing the coil current in the magnetic lens. Only a slight extra outlay on time results therefrom.

In accordance with an added mode of the invention, there is the step of using a structure contrast or a slope of a structural edge as the further parameter characterizing the structure.

In accordance with an additional mode of the invention, there is the step of using parabolas in each case for the first function and the second mathematical function.

In accordance with another mode of the invention, there is the step of calculating a sum of mean square deviations for the minimization steps.

In accordance with a further mode of the invention, there is the step of regulating a current flow in the magnetic lens of the electron microscope to adjust at least one of the first, second, and third focus values.

Other features which are considered as characteristic for the invention are set forth in the appended claims.

Although the invention is illustrated and described herein as embodied in a measurement technique for determining the width of a structure on a mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4a is a sectional view of a profile of a surface of a structure on a photomask; and FIG. 4b is a graph of an intensity distribution, determined with the aid of a scanning electron microscope, on the structure.

DESCRIPTION OF THE PREFERRED EMBODIMENTS

Figure 1:
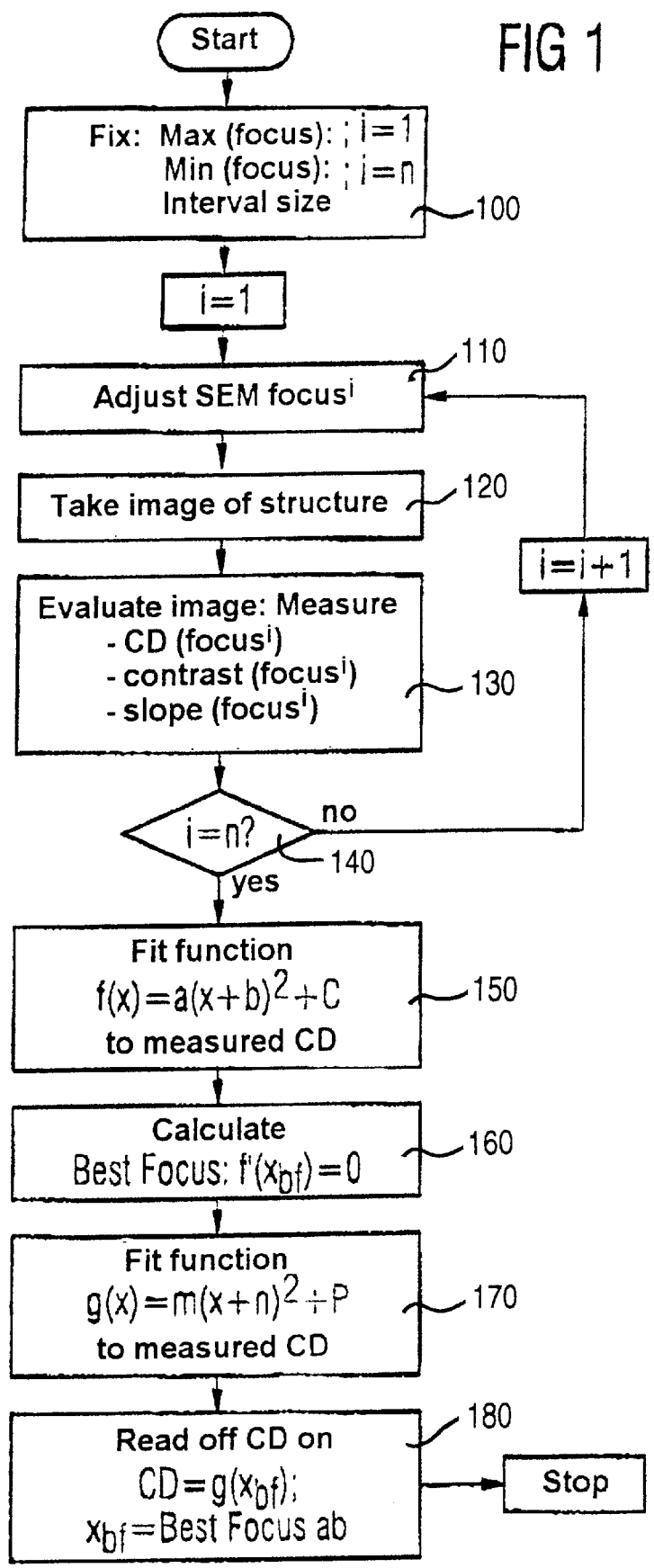
FIG. 1 is a flowchart of an exemplary embodiment in accordance with the invention.
Figure 2:
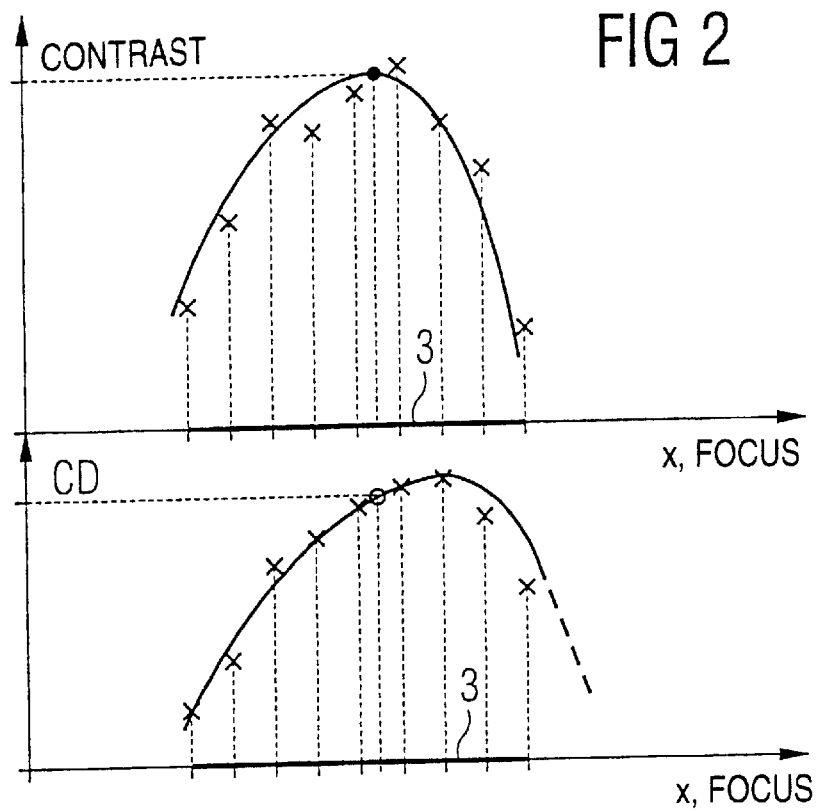
FIG. 2 is graph showing a fitting of mathematical functions for the purpose of determining a structural width.

Referring now to the figures of the drawing in detail and first, particularly, to FIG. 1 thereof, there is shown, by way of example, a sequence of the technique according to the invention. In this case, a maximum and a minimum value are fixed in advance for the focus, that is to say two values are determined for a current flow in a coil generating a magnetic lens, step 100. Furthermore, n−2 focal values that are likewise to be adjusted are determined in an equidistant fashion in the interval lying therebetween. n is the total number of the focal values to be traversed. First, the maximum focal value (minimum current in the coil) is adjusted.

Figure 3:
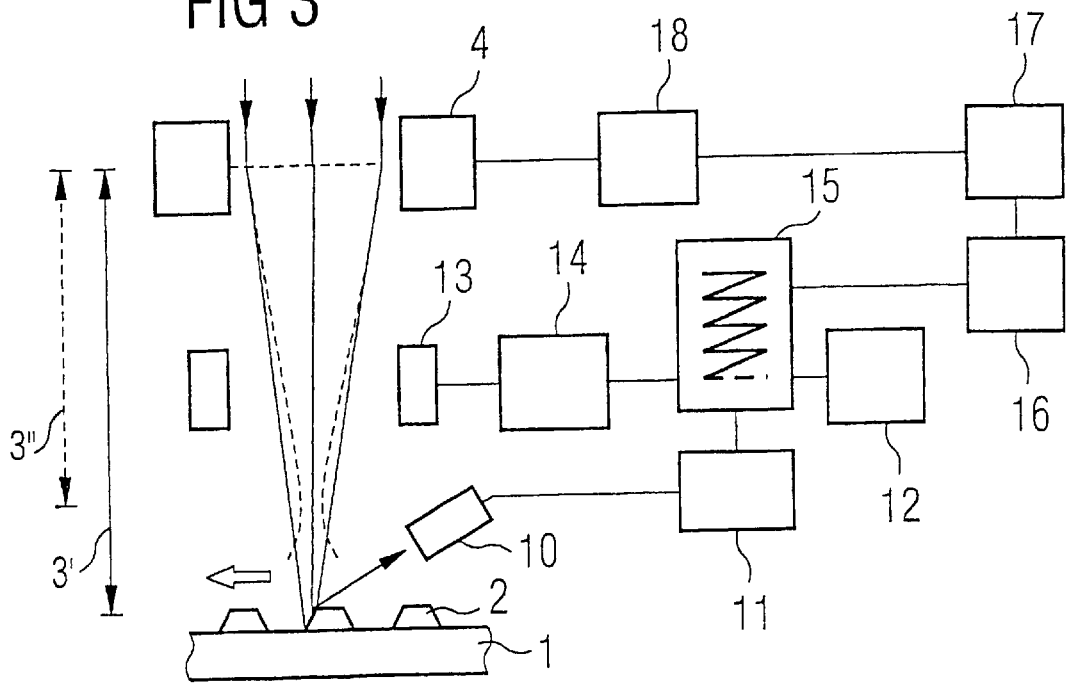
FIG. 3 is a block diagram of a configuration for applying the technique in accordance with the invention.

In FIG. 3, a scanning electron microscope is used to pick up the desired section of a surface having a structure 2 on a photomask 1 by a detector 10, amplified with the aid of a signal amplifier 11 and visualized on a display unit 15. In accordance with the basic principle of scanning electron microscopes, constructing the image is rendered possible by a raster generator 12 which carries out the synchronization with the signal coming from a deflecting unit 13 via a magnification control 14. The image taken can be evaluated by a connected evaluation unit 16 such that a structural width 5', a contrast 7 and a slope 6 (as intensity gradient) are present for an adjusted focus 3. A multiplicity of techniques and standards are generally used in order to derive the actual width 5 of the structure 2 on the photomask 1 from the structural width 5' of the measured intensity profile (FIG. 4B). A cross-sectional profile through the structure 2 to be measured on the photomask 1, as well as the intensity profile resulting therefrom in the scanning electron microscope are illustrated schematically and not to scale in FIGS. 4A and 4B. The intensity profile shown in FIG. 4B has at the rims of the structural edges overshooting profile curves which result from a particularly favored emission of excited secondary electrons at the upper edge corners, and/or from the reduced emission of the secondary electrons at the lower edge corners.

According to the invention, in a loop the next focal value (steps 110–140), that is to say a current flow in the coil, relating to a renewed image taking, is adjusted for the purpose of measuring the structural width 5, the contrast 7 and the slope 6 for the new focus 3, as is to be seen in FIG. 1. For this purpose, a control unit 17, which is connected to the evaluation unit 16, controls a current source or voltage source 18 for the purpose of inducing a magnetic field in the magnetic lens generated by a coil 4, as is to be seen in FIG. 3. The control unit 17 has a focal traverse for all prescribed values of the focus 3 until, finally, the minimum focus (maximum current flow) is adjusted and the structural width, the contrast and the slope are measured.

The measured values for the contrast 7 as a function of the focus 3 are now fitted by a parabolic function $$f(x)=a(x+b)^2+c,$$

the parameters a, b and c being determined in such a way that the mean quadratic deviations of the measured contrast values are minimized by the function, step 150. As a function of the focus 3, the structural contrast can typically be described by a downwardly open parabola. The maximum contrast 7 reflects the best focus 3', and is to be identified as a vertex of the parabola, that is to say that focus for which the first derivative of the function f(x) vanishes, step 160. The control unit 17 also carries out a functional fit of the function $$G(x)=m(x+p)^2+q,$$

to the measured values of the structural width 5. Here, as well, the parameters m, p and q are to be determined such that the mean quadratic deviations of the structural widths of the functions are minimized, step 170. That value, in the case of which the best focus obtained from the contrast fit is used for x, is to be read off on the function g(x) thus determined, step 180. This read-off value is the width 5 of the structure 2, which is affected by the very small error. Typically, n=10 values are traversed for the focus 3".

I claim:

1. A measurement technique for determining a width of a structure on a photomask, which comprises the steps of:

a) bringing the photomask with the structure into an object chamber of a scanning electron microscope;

b) adjusting a first focus value of a magnetic lens of the scanning electron microscope;

c) measuring a first width of the structure;

d) measuring a first value for a further parameter characterizing the structure;

e) adjusting a second focus value of the magnetic lens of the scanning electron microscope;

f) measuring a second width of the structure;

g) measuring a second value for the further parameter characterizing the structure;

h) adjusting a third focus value of the magnetic lens of the scanning electron microscope;

i) measuring a third width of the structure;

j) measuring a third value for the further parameter characterizing the structure;

k) adapting a first function with exactly one extreme value to the first, second and third values for the further parameter as a function of the first, second and third focuses, respectively, such that deviations of the first, second and third values from the first function are minimized;

l) determining a focus value assigned to the extreme value of the first function as a best focus;

m) adapting a second mathematical function with exactly one extreme value to the first, second and third widths of the structure as a function of the first, second and third focuses, respectively, such that deviations of the first, second and third widths from the second function are minimized; and n) determining the width of the structure in relation to a functional value of the second mathematical function which is assigned to the best focus.

2. The measurement technique according to claim 1, which comprises using a structure contrast as the further parameter characterizing the structure.

3. The measurement technique according to claim 1, which comprises using a slope of a structural edge as the further parameter characterizing the structure.

4. The measurement technique according to claim 1, which comprises repeating steps b), c) and d) a number of times before the first function is adapted.

5. The measurement technique according to claim 1, which comprises using parabolas in each case for the first function and the second mathematical function.

6. The measurement technique according to claim 4, which comprises calculating a sum of mean square deviations for the minimization in the steps k) and m).

7. The measurement technique according to claim 1, which comprises regulating a current flow in the magnetic lens of the electron microscope to adjust at least one of the first, second, and third focus values.

* * * * *